US010263359B2

(12) United States Patent
Nakamura et al.

(10) Patent No.: US 10,263,359 B2
(45) Date of Patent: Apr. 16, 2019

(54) POWER CONVERSION APPARATUS

(71) Applicant: Keihin Corporation, Tokyo (JP)

(72) Inventors: Kazuki Nakamura, Tochigi (JP);
Morifumi Shigemasa, Tochigi (JP);
Kenichi Sasaki, Utsunomiya (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 15/982,091

(22) Filed: May 17, 2018

(65) Prior Publication Data
US 2019/0013615 A1 Jan. 10, 2019

(30) Foreign Application Priority Data

Jul. 5, 2017 (JP) .................. 2017-131633

(51) Int. Cl.
H01R 12/00 (2006.01)
H01R 13/52 (2006.01)
H05K 5/00 (2006.01)
H05K 7/14 (2006.01)
H02M 7/00 (2006.01)

(52) U.S. Cl.
CPC ......... H01R 13/52 (2013.01); H01R 13/5213 (2013.01); H02M 7/003 (2013.01); H05K 5/0026 (2013.01); H05K 7/1427 (2013.01)

(58) Field of Classification Search
CPC ...... H05K 3/368; H01R 9/096; H01R 23/722; H01R 23/725

USPC .......................... 439/75, 65, 66, 74
See application file for complete search history.

(56) References Cited

U.S. PATENT DOCUMENTS 8,545,237 B2 * 10/2013 Johnson ............... H01R 12/523
439/75

FOREIGN PATENT DOCUMENTS

JP 2013-218870 10/2013

OTHER PUBLICATIONS

Japanese Decision to Grant a Patent with English translation dated Jul. 6, 2018, 6 pages.
Japanese Gazette of Registered Patent issued Jul. 4, 2018, U.S. Pat. No. 6,375,024, with English translation, 13 pages.

* cited by examiner

Primary Examiner — Phuong Chi T Nguyen
(74) Attorney, Agent, or Firm — Rankin, Hill & Clark LLP

(57) ABSTRACT

Provided is a power conversion apparatus that can enhance the strength of the vicinity of an opening through which a connector is exposed, and can prevent water from entering a casing through the opening or reduce such water intrusion. The power conversion apparatus includes a circuit board, a connector mounted on the circuit board, and a lid having an opening to allow the connector to be exposed therethrough and placed over the circuit board and the connector. The lid includes a bead that protrudes from a top plate to enclose an exposed portion of the connector.

7 Claims, 4 Drawing Sheets

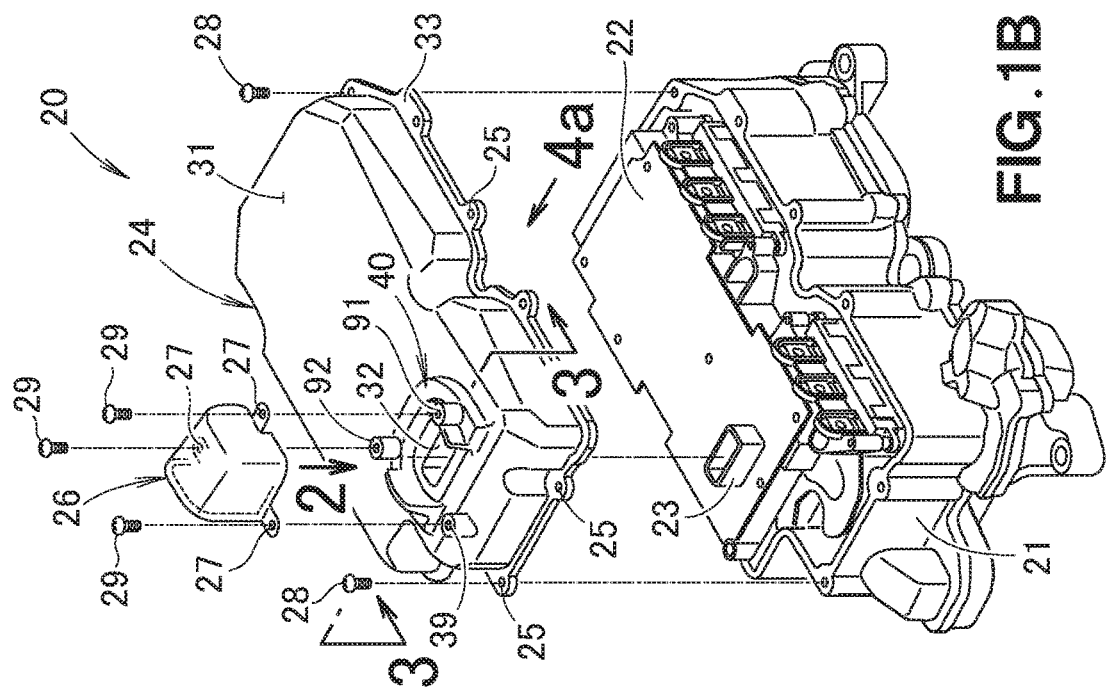
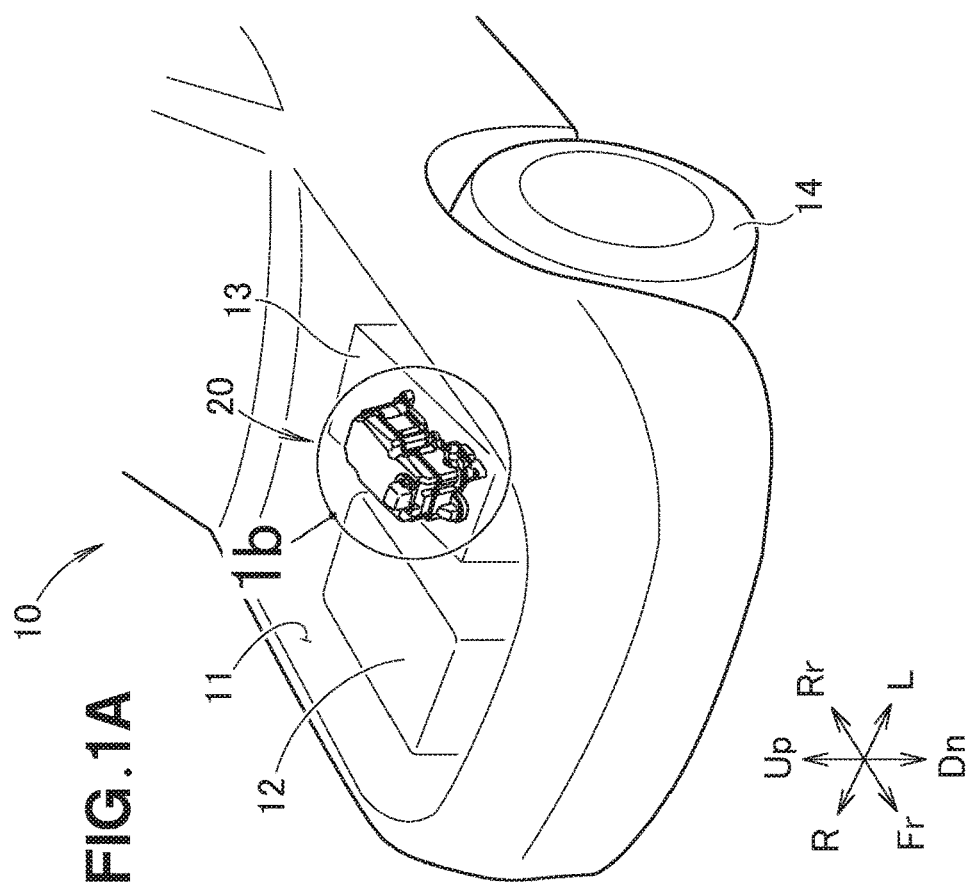

POWER CONVERSION APPARATUS

FIELD OF THE INVENTION

The present invention relates to a power conversion apparatus with an externally exposed connector.

BACKGROUND OF THE INVENTION

A variety of electronic components are mounted on a substrate in an electronic device. For example, there is known a circuit board that has a connector mounted thereon for connecting to another device. With regard to an electronic device including such a circuit board, Patent Literature Document 1 discloses an existing technique.

The electronic device disclosed in Patent Literature Document 1 includes a circuit board, a connector mounted on the circuit board, a bottom plate to which the circuit board is fixed, and a lid placed over the bottom plate and the circuit board. The lid has a side wall that encloses the circuit board, and a top plate that covers an upper portion of the circuit board. An opening is provided in the top plate to allow the connector to be exposed therethrough. When the lid is placed over the bottom plate and the circuit board, the connector becomes inserted in the opening and is exposed to the outside.

This electronic device is mounted in an engine compartment of a vehicle. Among the electronic devices mounted in an engine compartment of a vehicle, for example, there is a power conversion apparatus that controls the battery power. The power conversion apparatus is connected to another device via a cable connected to a connector.

Patent Literature Document 1: Japanese Patent Application Laid-Open Publication No. 2013-218870

SUMMARY OF THE INVENTION

The vicinity of the opening bends more easily than the rest of the top plate. When the vicinity of the opening bends due to the vibrations while the vehicle is traveling, a space may be produced between the connector and the opening. If such a space is produced while the vehicle is traveling in rain, it is conceivable that rainwater enters a casing through the opening. It is desirable that the bending of the vicinity of the opening can be suppressed and also that water can be prevented from entering the inside through the opening.

One object of the present invention is to provide a power conversion apparatus that can enhance the strength of the vicinity of an opening through which a connector is exposed, and can prevent water from entering a casing through the opening or reduce such water intrusion.

According to a first aspect of the present invention, there is provided is a power conversion apparatus that includes a circuit board, a connector mounted on the circuit board, and a lid having an opening to allow the connector to be exposed therethrough and placed over the circuit board and the connector. The lid includes a bead that protrudes from a top plate to enclose an exposed portion of the connector.

According to a second aspect of the present invention, it is preferred that the bead includes an upwardly protruding portion that extends higher than the connector.

According to a third aspect of the present invention, it is preferred that the power conversion apparatus further includes a cover member that covers an upper area of the opening, and the cover member is attached to the protruding portion.

According to a fourth aspect of the present invention, there is preferably provided a structure for mounting the power conversion apparatus onto a vehicle,
    the top plate of the lid is provided at an angle relative to a horizontal plane, and
    the bead continuously encloses the connector from a position higher than the connector to at least a height level of the connector with the inclined top plate serving as a reference.

According to the first aspect of the invention, the power conversion apparatus includes the lid placed over the circuit board and the connector. This lid has the bead that protrudes from the top plate to enclose the exposed portion of the connector. In other words, the bead is formed around the opening, and therefore the strength of the vicinity of the opening is enhanced. The bead encloses the exposed portion of the connector. Thus, water that could enter the inside through the opening in the lid is blocked by the bead. Consequently, the bead can enhance the strength of the vicinity of the opening, and prevent water from entering the inside through the opening or reduce such water intrusion.

According to the second aspect of the invention, the bead includes the upwardly protruding portion that extends higher than the connector. Thus, when a cable is connected to the connector, the connector can be prevented from contacting any necessary mounting part or the like.

According to the third aspect of the invention, the power conversion apparatus further includes the cover member that covers the upper area of the opening, and the cover member is attached to the protruding portion. In other words, the protruding portion functions as a member that supports the cover member. Furthermore, the cover member can protect the connector.

According to the fourth aspect of the invention, the structure for mounting the power conversion apparatus onto a vehicle is provided, and the top plate of the lid inclines relative to the horizontal plane. The bead continuously encloses the connector from a position higher than the connector to at least a height level of the connector with the inclined top plate serving as a reference. When water flows down toward the bead along the top plate, the water hits the bead formed at a position higher than the connector. This bead is formed continuously to the height level of the connector. Therefore, the water flows along the bead up to the height level of the connector. In other words, the water flows to avoid the opening through which the connector is exposed, and therefore it is possible to prevent or reduce the entering of the water to the inside through the opening.

BRIEF DESCRIPTION OF THE DRAWINGS

FIG. 1(a) illustrates a schematic diagram of a vehicle in which a power conversion apparatus according to an embodiment of the present invention is mounted, and FIG. 1(b) is an exploded perspective view of the power conversion apparatus.

DETAILED DESCRIPTION OF THE PREFERRED EMBODIMENTS

Figure 2:
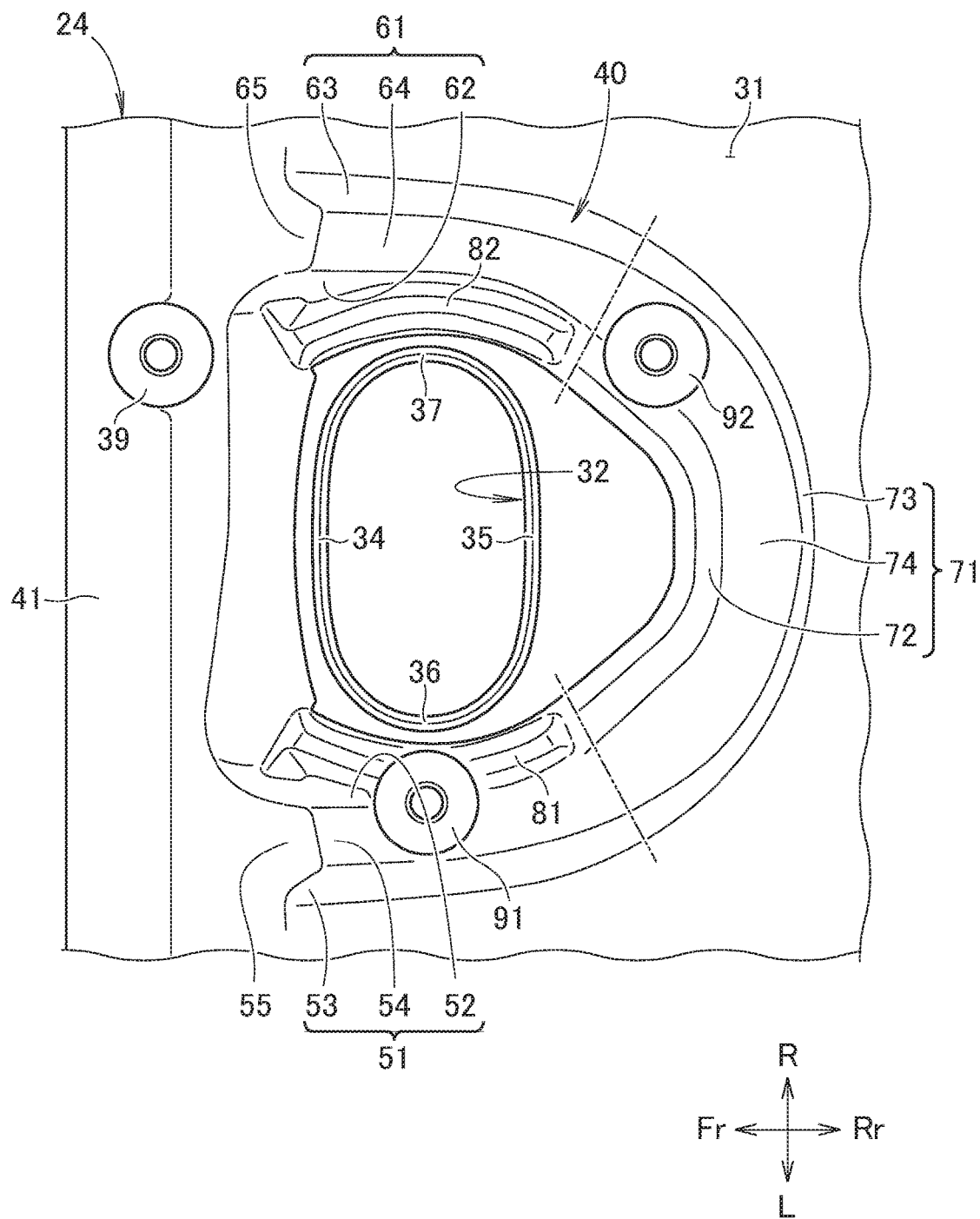
FIG. 2 is a view useful to describe the vicinity of an opening in a lid of the power conversion apparatus shown in FIG. 1(b).

Hereinafter, embodiments of the present invention will be described with reference to the accompanying drawings. In this specification, the right and the left are defined with a passenger in a vehicle serving as a reference, and the front and the rear are defined with the traveling direction of the vehicle serving as a reference. In the drawings, Fr indicates the front, Rr indicates the rear, L indicates the left as viewed from the passenger, R indicates the right as viewed from the passenger, Up indicates the upward, and Dn indicates the downward.

Embodiments

Referring to FIG. 1(*a*), this drawing illustrates a vehicle 10 in which a power conversion apparatus according to an embodiment of the present invention is mounted. The vehicle 10 is a hybrid vehicle in which an engine and a motor are mounted.

An engine compartment 11 is provided in a front portion of the vehicle 10. An engine 12 and a drive unit 13 are disposed in the engine compartment 11. A motor and a transmission are included in the drive unit 13. The motive power of the engine 12 and the motor in the drive unit 13 is transmitted to right and left front wheels 14 and 14 (only the front left wheel 14 is illustrated) via the transmission.

A power conversion apparatus 20 that controls the power of a battery for driving the motor is provided on an upper portion of the drive unit 13.

Referring to FIG. 1(*b*), the power conversion apparatus 20 includes a box body 21, a circuit board 22 housed in the box body 21, a connector 23 mounted on the circuit board 22, and a lid 24 placed over the circuit board 22 and the connector 23. Also housed in the box body 21 are a DC-DC converter that steps down the voltage of the battery (not shown), an inverter that transforms the voltage, and a capacitor. Descriptions of the detailed configurations and functions of the power conversion apparatus 20 will be omitted.

An opening 32 is formed in an upper surface portion 31 (top plate 31) of the lid 24 to allow the connector 23 to be exposed therethrough. A flange 33 that abuts the upper end of the side wall of the box body 21 is formed at a periphery (edge) of the lid 24. A plurality of screw holes 25 are formed in the flange 33.

When the lid 24 is placed over the box body 21, a portion of the connector 23 is exposed through the opening 32 (see FIG. 4(*b*)). The lid 24 is fixed to the box body 21 with a plurality of screws 28. The connector 23 is covered by a cover member 26. The cover member 26 has a box shape with its lower and right sides open, and three attachment portions 27 are formed on the cover member 26. The cover member 26 is fixed to the lid 24 with three screws 29.

Referring to FIG. 1(*b*) and FIG. 2, the opening 32 has a racetrack-like shape and includes a first straight portion 34, a second straight portion 35, a first semicircular portion 36, and a second semicircular portion 37. The first and second straight portions 34 and 35 extend in the right-left direction (the widthwise direction of the vehicle), the first semicircular portion 36 connects the left ends of the first and second straight portions 34 and 35, and the second semicircular portion 37 connects the right ends of the first and second straight portions 34 and 35.

The upper surface portion 31 of the lid 24 includes a bead 40 that encloses the exposed portion of the connector 23. The bead 40 has a generally C shape and opens toward the first straight portion 34 (toward the front). The bead 40 protrudes upward from the upper surface portion 31.

Specifically, the bead 40 is constituted by a first bead portion 51 that covers the first semicircular portion 36, a second bead portion 61 that covers the second semicircular portion 37, and a third bead portion 71 that covers the second straight portion 35. The third bead portion 71 curves and protrudes rearward. The first bead portion 51, the second bead portion 61, and the third bead portion 71 are formed continuously.

The first bead portion 51 includes a first inner wall 52 serving as an inner peripheral side of the C shape, a first outer wall 53 serving as an outer peripheral side of the C shape, and a first upper end 54 connecting the first inner wall 52 and the first outer wall 53.

In a similar manner, the second bead portion 61 includes a second inner wall 62, a second outer wall 63, and a second upper end 64, and the third bead portion 71 includes a third inner wall 72, a third outer wall 73, and a third upper end 74.

Figure 3:
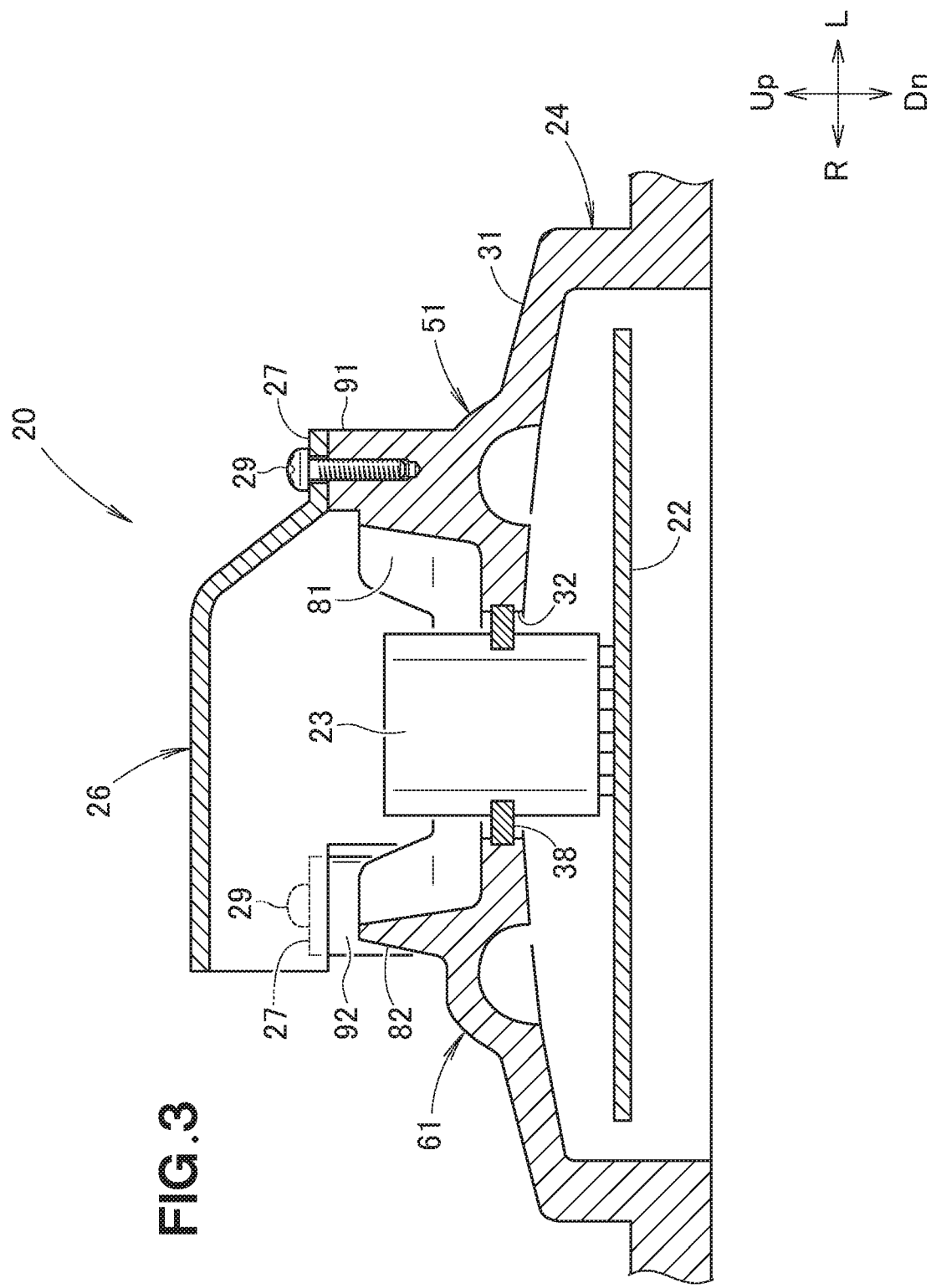
FIG. 3 is a cross-sectional view taken along the 3-3 line in FIG. 1(b).

Referring to FIG. 2 and FIG. 3, the bead 40 includes a first wall portion 81 (first protruding portion 81) and a second wall portion 82 (second protruding portion 82) that extend upward from the upper surface portion 31.

The first wall portion 81 is formed along the first inner wall 52. The first wall portion 81 curves and protrudes leftward. In a similar manner, the second wall portion 82 is formed along the second inner wall 62. The second protruding portion 82 curves and protrudes rightward.

The bead 40 further includes a first boss 91 (third protruding portion 91) and a second boss 92 (fourth protruding portion 92).

The first boss 91 extends upward from the first upper end 54. The second boss 92 extends upward from the third upper end 74. The second boss 92 is located near a boundary between the second bead portion 61 and the third bead portion 71.

A third boss 39 is formed at a front end 41 of the lid 24. The third boss 39 is located such that the second wall portion 82 is present between the third boss 39 and the second boss 92. The first boss 91, the second boss 92, and the third boss 39 are located at equal intervals.

Referring to FIG. 3, a seal member 38 is disposed between the connector 23 and the opening 32. The first wall portion 81, the second wall portion 82, the first boss 91, and the second boss 92 all extend upward and are higher than the connector 23. The attachment portions 27 each abut the upper surface of the corresponding one of the first boss 91, the second boss 92, and the third boss 39 (see FIG. 1(*b*)).

Referring to FIG. 4(*a*), when the power conversion apparatus 20 is attached to the drive unit 13 (see FIG. 1(*a*)), the upper surface portion 31 of the lid 24 inclines at a certain angle relative to a horizontal plane H in a front-down posture (angle of inclination θ). The connector 23 is located at a lowermost portion with the inclined upper surface portion 31 serving as a reference.

The bead 40 encloses the connector 23 continuously from a position higher than the connector 23 to a position lower than the connector 23 with the inclined upper surface portion 31 serving as a reference.

Referring to FIG. 2, the third bead portion 71 is formed at a position higher than the second straight portion 35. A first front end 55 of the first bead portion 51 and a second front end 65 of the second bead portion 61 are formed at positions lower than the first straight portion 34.

Advantageous effects of the embodiment of the present invention will now be described.

Referring to FIG. 2 and FIG. 4(*b*), the power conversion apparatus 20 includes the lid 24 placed over the circuit board 22 and the connector 23. The lid 24 includes the bead 40 that protrudes from the upper surface portion 31 to enclose the exposed portion of the connector 23. In other words, the bead 40 is formed around the opening 32, and therefore the strength of the vicinity of the opening 32 is enhanced. The bead 40 encloses the exposed portion of the connector 23. Thus, water that could enter the inside of the power conversion apparatus through the opening 32 in the lid 24 is blocked by the bead 40. Consequently, the bead 40 can enhance the strength of the vicinity of the opening 32, prevent a space from being produced around the seal member 38 in association with bending, and prevent water from entering the inside of the power conversion apparatus through the opening 32.

The bead 40 and the upper surface portion 31 have an equal thickness. Therefore, when the lid 24 is formed through die casing or the like, little variation arises in the quality of the lid 24.

Referring to FIG. 2 and FIG. 3, the first wall portion 81 (first protruding portion 81), the second wall portion 82, (second protruding portion 82), the first boss 91 (third protruding portion 91), and the second boss 92 (fourth protruding portion 92) extend upward and are higher than the connector 23. Therefore, when a cable is connected to the connector 23, it is possible to prevent the connector 23 from contacting any necessary mounting part or the like.

In particular, the first boss 91 extends upward from the upper end 54 of the first bead portion 51, and the second boss 92 extends upward from the upper end 74 of the third bead portion 71. In other words, the first boss 91 and the second boss 92 are raised by the bead 40. Therefore, the heightwise dimensions of the first boss 91 and the second boss 92 can be kept small. When the lid 24 is formed through die casing or the like, running of the raw material (hot liquid) improves.

The power conversion apparatus 20 further includes the cover member 26 that covers the upper area (space) of the opening 32. The cover member 26 is attached to the first boss 91, the second boss 92, and the third boss 39. The first boss 91 and the second boss 92 prevent the connector 23 from contacting any necessary mounting part or the like, and also function as members that support the cover member 26. The cover member 26 can protect the connector 23.

Figures 4A, 4B:
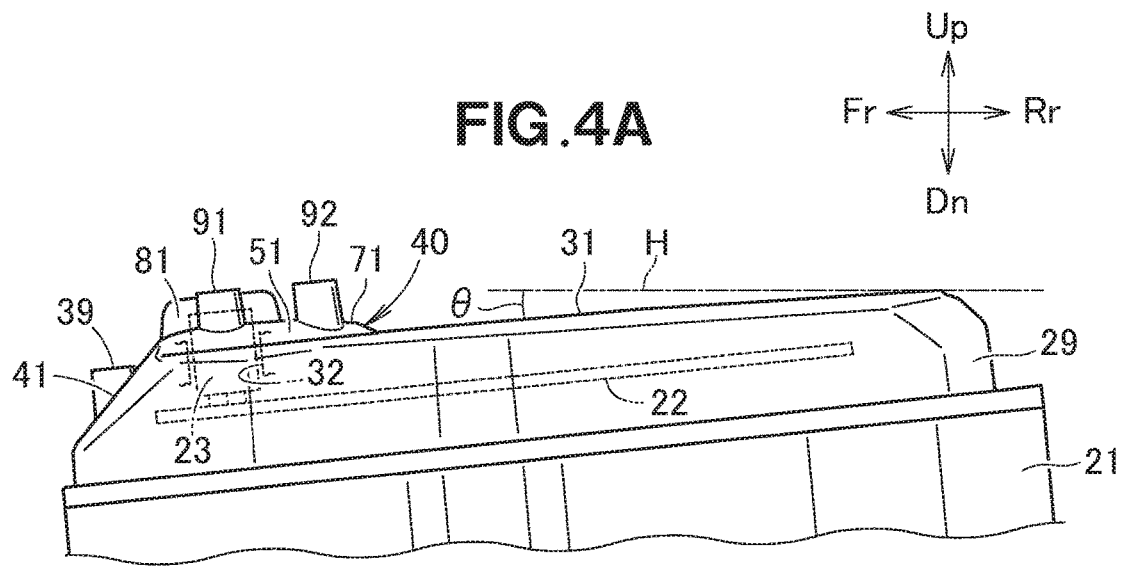
FIG. 4(a) and FIG. 4(b) are views useful to describe functions and advantageous effects of the embodiment of the present invention.

Referring to FIG. 4(a), when the power conversion apparatus 20 is attached to the drive unit 13, the upper surface portion 31 of the lid 24 inclines at an angle relative to the horizontal plane H in a front-down posture (angle of inclination θ). The connector 23 is located at a lowermost portion with the inclined upper surface portion 31 serving as a reference.

The bead 40 encloses the connector 23 continuously from a position higher than the connector 23 to a position lower than the connector 23 with the inclined upper surface portion 31 serving as a reference.

Referring to FIG. 4(b), as indicated by the arrow (1), when water flows down toward the bead 40 along the upper surface portion 31, the water hits the third bead portion 71 formed at a position higher than the connector 23. The third bead portion 71 is formed continuously with the first bead portion 51 and the second bead portion 61. Thus, as indicated by the arrows (2), the water flows along the first bead portion 51 and/or the second bead portion 61. In other words, the water flows to avoid the opening 32, and therefore it is possible to prevent the water from entering the inside of the power conversion apparatus through the opening 32.

In addition, the bead 40 is located at a lowermost portion with the inclined upper surface portion 31 serving as a reference. The bead 40 extends such that the first front end 55 and the second front end 65 are located in the vicinity of the front end 41 of the lid 24. Therefore, as indicated by the arrow (3), the water that has flowed along the bead 40 falls directly downward from the upper surface portion 31 of the lid 24. Consequently, the water is less likely to stay on the upper surface portion 31 of the lid 24.

It should be noted that the present invention is not limited to the embodiment as long as the functions and the advantageous effects of the present invention are obtained. The power conversion apparatus can be mounted onto (or in) vehicles other than hybrid vehicles and also in other transportation bodies and facilities. The shape of the bead 40 may be a U shape, a V shape, or an O shape, and a plurality of beads may be formed around the connector. The first wall portion 81, the second wall portion 82, the first boss 91, and the second boss 92 may be formed on the upper surface portion 31.

INDUSTRIAL APPLICABILITY

The power conversion apparatus is advantageously used in a four-wheel vehicle.

REFERENCE NUMERALS

10 Vehicle
11 Engine compartment
12 Engine
13 Drive unit
14 Front wheels
20 Power conversion apparatus
21 Box body
22 Circuit board
23 Connector
24 Lid
26 Cover member
27 Attachment portion
28 Screw
29 Screw
31 Upper surface portion (top plate)
32 Opening
34 First straight portion
35 Second straight portion
36 First semicircular portion
37 Second semicircular portion
38 Seal member
39 Third boss
40 Bead
41 Front end
51 First bead portion
52 First inner wall
53 First outer wall
54 First upper end
55 First front end
61 Second bead
62 Second inner wall
63 Second outer wall
64 Second upper end
65 Second front end
71 Third bead portion
72 Third inner wall
73 Third outer wall
74 Third upper end
81 First wall portion (first protruding portion)
82 Second wall portion (second protruding portion)
91 First boss (third protruding portion)
92 Second boss (fourth protruding portion)
H Horizontal plane

What is claimed is:

1. A power conversion apparatus comprising:
a circuit board;
a connector mounted on the circuit board; and
a lid that is placed over the circuit board and the connector, said lid having a top plate that defines an opening through which the connector extends so as to define an exposed portion of the connector, and
wherein the lid integrally includes a bead that protrudes upwardly from the top plate and extends at least partially around the opening so as to at least partially surround the opening and the exposed portion of the connector that extends from said opening.

2. A structure for mounting the power conversion apparatus of claim 1 onto a vehicle, wherein the top plate of the lid is provided at an angle relative to a horizontal plane, and
the bead continuously encloses the connector and is at a position ranging from higher than any portion of the connector to at least a height level with a highest portion of the connector, using the top plate as a reference.

3. The power conversion apparatus according to claim 1, wherein the bead includes an upwardly protruding portion that is relatively higher than any portion of the connector.

4. The power conversion apparatus according to claim 3, further comprising a cover member that extends over and covers the opening, and wherein the cover member is attached to the protruding portion.

5. A power conversion apparatus comprising:
a circuit board;
a connector mounted on the circuit board; and
a lid that is placed over the circuit board and the connector, said lid having a top plate that defines an opening through which the connector extends so as to define an exposed portion of the connector,
wherein the lid integrally includes a bead that protrudes upwardly from the top plate and extends at least partially around the opening so as to at least partially surround the exposed portion of the connector that extends from said opening; and,
a cover member that extends over and covers the opening, and wherein the cover member is attached to the bead.

6. The power conversion apparatus of claim 5, wherein the top plate of the lid is provided at an angle relative to a horizontal plane, and
the bead continuously encloses the connector and is at a position ranging from higher than any portion of the connector to at least a height level with a highest portion of the connector, using the top plate as a reference.

7. A power conversion apparatus comprising:
a circuit board;
a connector mounted on the circuit board; and
a lid that is placed over the circuit board and the connector, said lid having a top plate that defines an opening through which the connector extends so as to define an exposed portion of the connector,
wherein the lid integrally includes a bead that protrudes upwardly from the top plate and extends at least partially around the opening so as to at least partially surround the exposed portion of the connector that extends from said opening; and,
wherein the bead includes an upwardly protruding portion that is relatively higher than any portion of the connector.

* * * * *